(12) United States Patent
Wan

(10) Patent No.: US 10,263,581 B2
(45) Date of Patent: Apr. 16, 2019

(54) AMPLIFIER CALIBRATION

(71) Applicant: ANALOG DEVICES, INC., Norwood, MA (US)

(72) Inventor: Quan Wan, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/282,941

(22) Filed: Sep. 30, 2016

(65) Prior Publication Data

US 2018/0097491 A1    Apr. 5, 2018

(51) Int. Cl.
   *H03G 1/00*   (2006.01)
   *H03F 3/45*   (2006.01)
   *H03G 3/10*   (2006.01)

(52) U.S. Cl.
   CPC ....... *H03G 1/0088* (2013.01); *H03F 3/45475* (2013.01); *H03F 3/45941* (2013.01); *H03F 3/45995* (2013.01); *H03F 2203/45044* (2013.01); *H03F 2203/45048* (2013.01); *H03F 2203/45151* (2013.01); *H03F 2203/45538* (2013.01); *H03F 2203/45591* (2013.01); *H03F 2203/45616* (2013.01)

(58) Field of Classification Search
   USPC .................................................. 330/252–261
   See application file for complete search history.

(56) References Cited

U.S. PATENT DOCUMENTS

| | | | |
|---|---|---|---|
| 5,999,115 A | 12/1999 | Connell et al. | |
| 6,137,365 A * | 10/2000 | Wakairo | H03G 1/0088 330/282 |
| 6,362,684 B1 | 3/2002 | Klein et al. | |
| 6,958,720 B1 | 10/2005 | Prater | |
| 7,250,890 B1 | 7/2007 | Wong | |
| 7,548,115 B1 | 6/2009 | Liu | |
| 7,570,114 B2 | 8/2009 | Tansley et al. | |
| 7,737,772 B2 * | 6/2010 | Lee | H03H 11/1291 327/552 |
| 8,093,985 B1 | 1/2012 | Kumath et al. | |
| 9,337,792 B1 * | 5/2016 | Shou | H03G 1/0029 |

* cited by examiner

*Primary Examiner* — Hieu P Nguyen
(74) *Attorney, Agent, or Firm* — Knobbe, Martens, Olson & Bear, LLP

(57) ABSTRACT

An amplifier circuit can include an amplifier and a resistor network coupled to the amplifier. The resistor network can include a range resistor coupled in parallel to a resistor string, and one or more switches coupled to the resistor string. The resistor network can be used to calibrate gain and common mode rejection ratio (CMRR) of the amplifier circuit.

26 Claims, 8 Drawing Sheets

AMPLIFIER CALIBRATION

BACKGROUND

Technical Field

Embodiments in this disclosure generally relate to circuits and techniques for calibrating amplifiers. Some embodiments relate to using resistors and switches to calibrate difference amplifiers.

Description of Related Technology

Amplifiers have many uses in modern electronics. However, fabricated amplifiers may have imperfections. Calibrating an imperfect amplifier can improve the amplifier's performance. Device manufacturers can sell amplifiers to end users who use the amplifiers under a variety of voltage conditions.

SUMMARY

One aspect of this disclosure is a circuit for calibrating a performance characteristic of an operational amplifier system. The circuit comprises an operational amplifier and a resistor network. The operational amplifier comprises a first input, a second input, and an output. The resistor network is coupled to the first input of the operational amplifier and is configured to adjust a ratio of resistances. The resistor network comprises a range resistor electrically coupled in parallel to a resistor string, and a plurality of switches coupled to the resistor string.

In some embodiments, the plurality of switches is coupled to the first input. In some embodiments, the circuit further comprises a resistor coupled to the resistor network and to the input of the operational amplifier. In some embodiments, the resistor network is coupled to the output of the operational amplifier. In some embodiments, activation of different switches of the plurality of switches couples the first input to different parts of the resistor string. In some embodiments, the circuit further comprises a plurality of resistors including a first resistor, a second resistor, a third resistor, and a fourth resistor, the plurality of resistors arranged to configure the operational amplifier as a difference amplifier, the first resistor coupled to a first input of the difference amplifier, the second resistor coupled to a second input of the difference amplifier, the third resistor coupled to a reference voltage, and the fourth resistor coupled to the output of the difference amplifier. In some embodiments, the resistor network is coupled to a selected resistor of the plurality of resistors such that a resistance of the selected resistor in combination with a resistance of the resistor network affects a common mode rejection ratio or a gain of the difference amplifier. In some embodiments, he resistor network is coupled in a feedback configuration to the fourth resistor and to the second input of the operational amplifier. In some embodiments, a resistance of the range resistor is less than a resistance of any resistor of the plurality of resistors. In some embodiments, the plurality of resistors occupies a smaller die area than a die area occupied by the range resistor. In some embodiments, the plurality of switches is implemented as a plurality of transistors, and voltage drops across any activated transistor of the plurality of transistors are less than 0.1 V.

Another aspect of this disclosure features a circuit for calibrating a difference amplifier. The circuit comprises an operational amplifier configured to amplify a difference between a signal at a first input and a signal at a second input and a means for adjusting a common mode rejection ratio (CMRR) or a gain. The means for adjusting comprises a means for electrically coupling the operational amplifier to different parts of the resistor string and a means electrically coupling a range resistor in parallel to a resistor string.

In some embodiments, the means for electrically coupling the operational amplifier to different parts of the resistor string comprises a plurality of switches, wherein each switch of the plurality of switches coupled to the first input of the operational amplifier, wherein different switches of the plurality of switches is coupled to the different parts of the resistor string, wherein activation of a first switch configures the different amplifier with a first CMRR or gain, and wherein activation of a second switch configures the difference amplifier with a second CMRR or gain. In some embodiments, the means for adjusting the common mode rejection ratio (CMRR) or the gain is a means for adjusting the CMRR, the circuit also comprising a means for adjusting the gain of the difference amplifier. In some embodiments, the circuit further comprises a means for controlling which part of the resistor string that the operational amplifier is coupled to. In some embodiments, the means for electrically coupling the operational amplifier to different parts of the resistor string comprises a means for electrically coupling the operational amplifier to only part of the resistor string. In some embodiments, the operational amplifier is coupled to a first part of the resistor string such that the CMRR is greater than or the gain is closer to a specified value compared to a result when the operational amplifier is coupled to a different part of the resistor string. In some embodiments, the resistor string comprises a plurality of resistors, wherein the range resistor has a smaller resistance than any resistor of the plurality of resistors, and wherein the range resistor occupies a larger die surface area than the plurality of resistors.

Another aspect of the disclosure features a method for calibrating a circuit. The method comprises applying a first test input voltage to a range resistor coupled in parallel with a resistor string and adjusting a tap point at which the resistor string is contacted such that a gain error threshold or a common mode rejection ratio threshold is satisfied.

In some embodiments, adjusting the tap point comprises turning on and off different combinations of switches, wherein the switches are coupled to different tap points of the resistor string.

Another aspect of this disclosure is a circuit for calibrating a difference amplifier. The circuit comprises an operational amplifier and a resistor network. The operational amplifier comprises a first input configured to receive a first input signal, a second input configured to receive a second input signal, and an output configured to generate an output signal based at least in part on a difference between the first input signal and the second input signal. The resistor network comprises a range resistor electrically coupled to a first circuit node and to a second circuit node. The resistor network also comprises a plurality of resistors electrically coupled with each other in series. The plurality of resistors is electrically coupled in parallel with the range resistor with respect to the first circuit node and the second circuit node. The resistor network also comprises a plurality of switches. Each switch of the plurality of switches is coupled to the first input of the operational amplifier and to at least one resistor of the plurality of resistors. At least a first switch of the plurality of switches is further coupled to the first circuit node, and at least a second switch of the plurality of switches is further coupled to the second circuit node, wherein activation of one switch configures the resistor network with a first resistance and activation of a second switch configures the resistor network with a second resistance.

The system can include a first resistor coupled to an input of the difference amplifier and to the first input of the operational amplifier. The system can include a second resistor network coupled to an input of the difference amplifier and to the second input of the operational amplifier. The system can include a control circuit configured to control a state of the plurality of switches. In some systems, only one switch of the plurality of switches is in a closed state. In some systems, only one switch of the plurality of switches is in a closed state and at least one remaining switch of the plurality of switches is in an open state. In some systems, the range resistor has a smaller resistance than any resistor of the plurality of resistors, and the range resistor occupies a larger die surface area than the plurality of resistors. In some systems, only one switch of the plurality of switches is in a closed state and at least one remaining switch of the plurality of switches is in an open state such that the common mode rejection ratio (CMRR) of the difference amplifier is maximized compared to other permutations of switch states of the plurality of switches. In some systems, each of the plurality of switches is connected directly to the first input of the operational amplifier.

Another aspect of this disclosure features a circuit for calibrating a performance characteristic of an operational amplifier system. The circuit comprises an operational amplifier that includes a first input, a second input, and an output. The circuit also includes a resistor network coupled to the operational amplifier. The resistor network includes a range resistor electrically coupled to a first node and a second node, a plurality of resistors electrically coupled in series with each other and electrically coupled in parallel with the range resistor from the first node to the second node; and a plurality of switches, a particular switch of the plurality of switches coupled to a switch output node and to a particular resistor of the plurality of resistors. Activation of at least one switch of the plurality of switches configures the resistor network with a resistance value as measured from the switch output node to the second node.

The circuit can include the switch output node being coupled to the first input or the second input. A resistor can be coupled to the resistor network and also coupled to the input of the operational amplifier. The resistor network can be coupled to the output of the operational amplifier. Activation of a different switch of the plurality of switches can configure the resistor network with a different resistance values as measured from the switch output node to the second node. The circuit can include a plurality of resistors including a first resistor, a second resistor, a third resistor, and a fourth resistor, the plurality of resistors arranged to configure the operational amplifier as a difference amplifier. The first resistor can be coupled to a first input of the difference amplifier, the second resistor can be coupled to a second input of the difference amplifier, the third resistor can be coupled to a voltage reference of the difference amplifier, and the fourth resistor can be coupled to the output of the difference amplifier. The resistor network can be coupled to a selected resistor of the plurality of resistors such that a resistance of the selected resistor in combination with a resistance of the resistor network affects a CMRR or a gain of the difference amplifier. The resistor network can be coupled in a feedback configuration to the fourth resistor and to the second input of the operational amplifier. A resistance of the range resistor can be less than a resistance of any resistor of the plurality of resistors. The plurality of resistors can occupy a smaller die area than a die area occupied by the range resistor. The plurality of switches can be implemented as a plurality of transistors, and wherein voltage drops across any activated transistor of the plurality of transistors is negligible (e.g., less than 100 mV, less than 1 mV, less than 1 µV, less than 1 nV).

Another aspect of the disclosure features a method for calibrating a circuit. A range resistor is coupled in parallel with a resistor string, the resistor string comprising a plurality of resistors coupled in series. A plurality of switches is coupled to the resistor string and a switch output node to form a resistor network. The resistor network comprises the range resistor, the resistor string, and the plurality of switches. The resistor network is coupled to a first resistor and to an operational amplifier. A state of at least one of the plurality of switches is configured to satisfy a gain error threshold or a CMRR threshold.

The method can include packaging the circuit into a packaged circuit. Configuring the state of the at least one of the plurality of switches can be based at least in part on a performance characteristic of the packaged circuit.

For purposes of summarizing the disclosure, certain aspects, advantages, and novel features of the inventions have been described herein. It is to be understood that not necessarily all such advantages can be achieved in accordance with any particular embodiment of the invention. Thus, the invention can be embodied or carried out in a manner that achieves or optimizes one advantage or group of advantages as taught herein without necessarily achieving other advantages as can be taught or suggested herein.

DETAILED DESCRIPTION

Overview

Amplifiers have a variety of applications in a wide range of fields spanning from consumer electronics to automotive to microelectronics to aerospace industries. As a result, an amplifier may operate under a wide range of conditions, including conditions where the differential input voltage may be very small (e.g., millivolts, about 1 to 10 volts) and the common mode input measures hundreds of volts. Small circuits, signal detectors, and microelectronics may amplify signals smaller than 0.1 V. On the other hand, automotive, machinery, and aerospace applications may use amplifiers on large signals ranging up to 50 volts or higher.

A difference amplifier can amplify a difference between two input signals (e.g., signals Vin_n and Vin_p shown in FIGS. 4, 5, and 6) by a gain factor and reject a common mode voltage applied to both inputs of the difference amplifier so that the same gain will be applied to a differential voltage between the signal inputs, regardless of any common mode voltage signals provided to both inputs. The common mode rejection ratio (CMRR) can be used to characterize an amplifier's ability to reject a common mode signal.

It can be desirable to make a difference amplifier with a precise gain and high CMRR. However, imperfections in fabrication, varying ambient conditions, packaging stress, and a number of other variables can reduce the gain precision and CMRR. To account for these variations, a circuit can be used to calibrate the gain and CMRR. This can include adjusting the resistances of one or more resistors (e.g., resistors R1, R2, R3, and R4 in FIGS. 4, 5, and 6) coupled to the amplifier.

Figure 6:
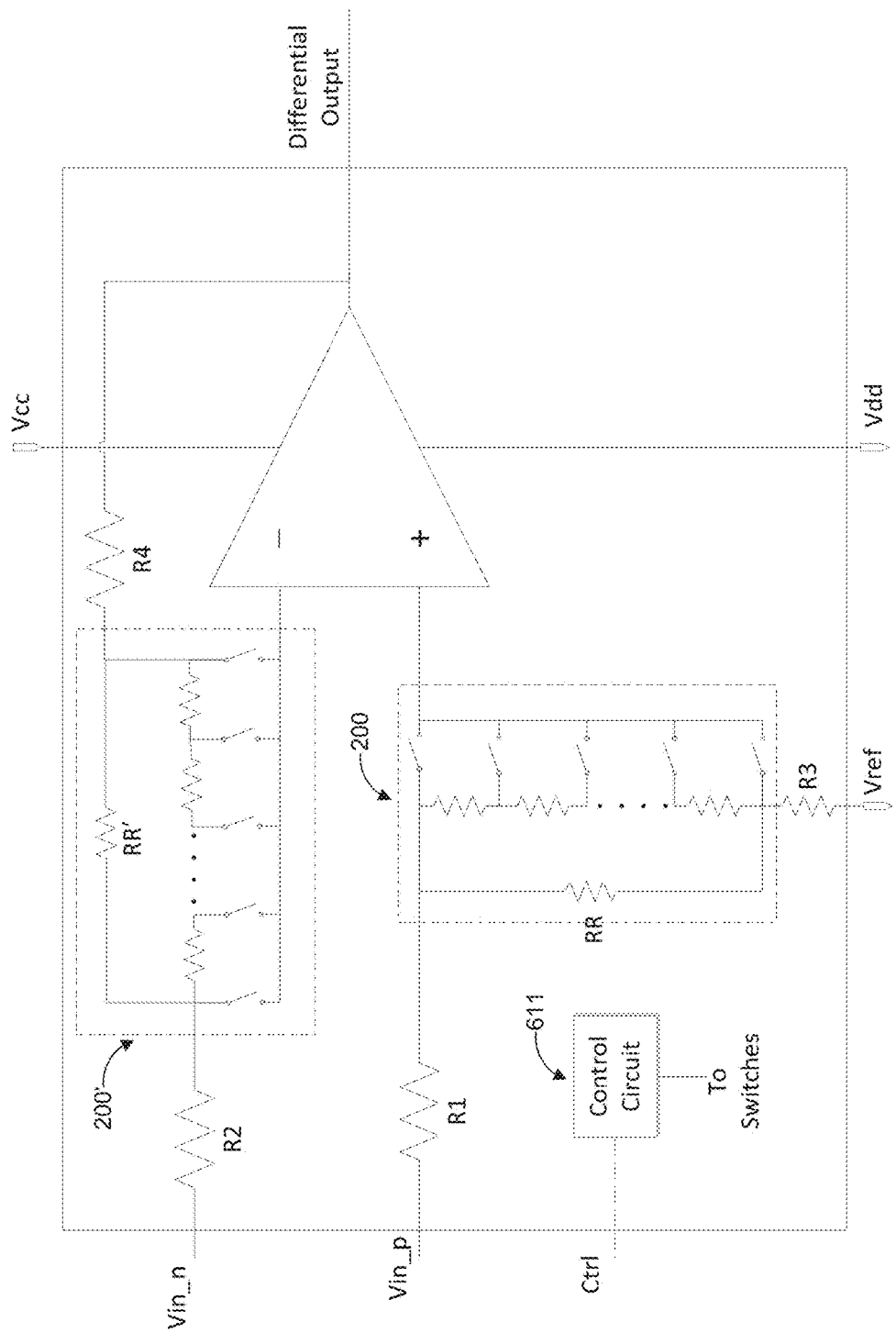
FIG. 6 shows an example difference amplifier circuit with resistor strings and with range resistors in parallel with the resistor strings for calibrating the CMRR and for calibrating the gain.

For a difference amplifier with resistors R1, R2, R3, and R4 such as shown in FIG. 6 (ignoring, for now, the presence of other circuit elements), the gain and CMRR can be typically approximated as follows:

$$\text{Gain} = \frac{R4}{R2} = \frac{R3}{R1}$$

$$CMRR = \left(1 + \frac{R3}{R1}\right) * \frac{R1}{\Delta R}$$

Typically, for calibrated gain, R4/R2=R3/R1. The CMRR is also affected by how well the ratio of R4/R2 matches that of R3/R1. ΔR represents the deviation of R1 from the ideal value that makes R4/R2=R3/R1. Accordingly, R1 can be calibrated to make R4/R2 more closely equal to R3/R1. The principles described herein can be applied to calibrate the other resistors instead of or in addition to R1. In practice, the ratios R4/R2 and R3/R1 can be adjusted by modifying a circuit to include one or more additional resistors along a circuit path in series with R1, R2, R3, or R4 without modifying the resistances of R1, R2, R3, or R4. Nonetheless, one of ordinary skill in the art will understand that such techniques can be considered a modification of the resistances of R1, R2, R3, or R4 for practical purposes.

There are at least two opportunities when a difference amplifier fabricated on a wafer, such as silicon or other semiconductor, can be calibrated: before the amplifier is packaged and after the amplifier is packaged. Before the amplifier is packaged, resistors can be adjusted, for example, by laser trimming at the wafer level to improve the gain and CMRR. Techniques for trimming are disclosed in U.S. Pat. No. 7,570,114 by Tomas Tansley et al filed as U.S. App. No. on Jul. 24, 2007, the disclosure of which is hereby incorporated by reference in its entirely for all purposes. However, packaging a wafer can induce stress and mismatches that distort the gain and CMRR. Therefore, other techniques can be performed to calibrate the gain and CMRR after the difference amplifier is packaged so that stress, mismatch, and other package effects can be accounted for.

Figure 4:
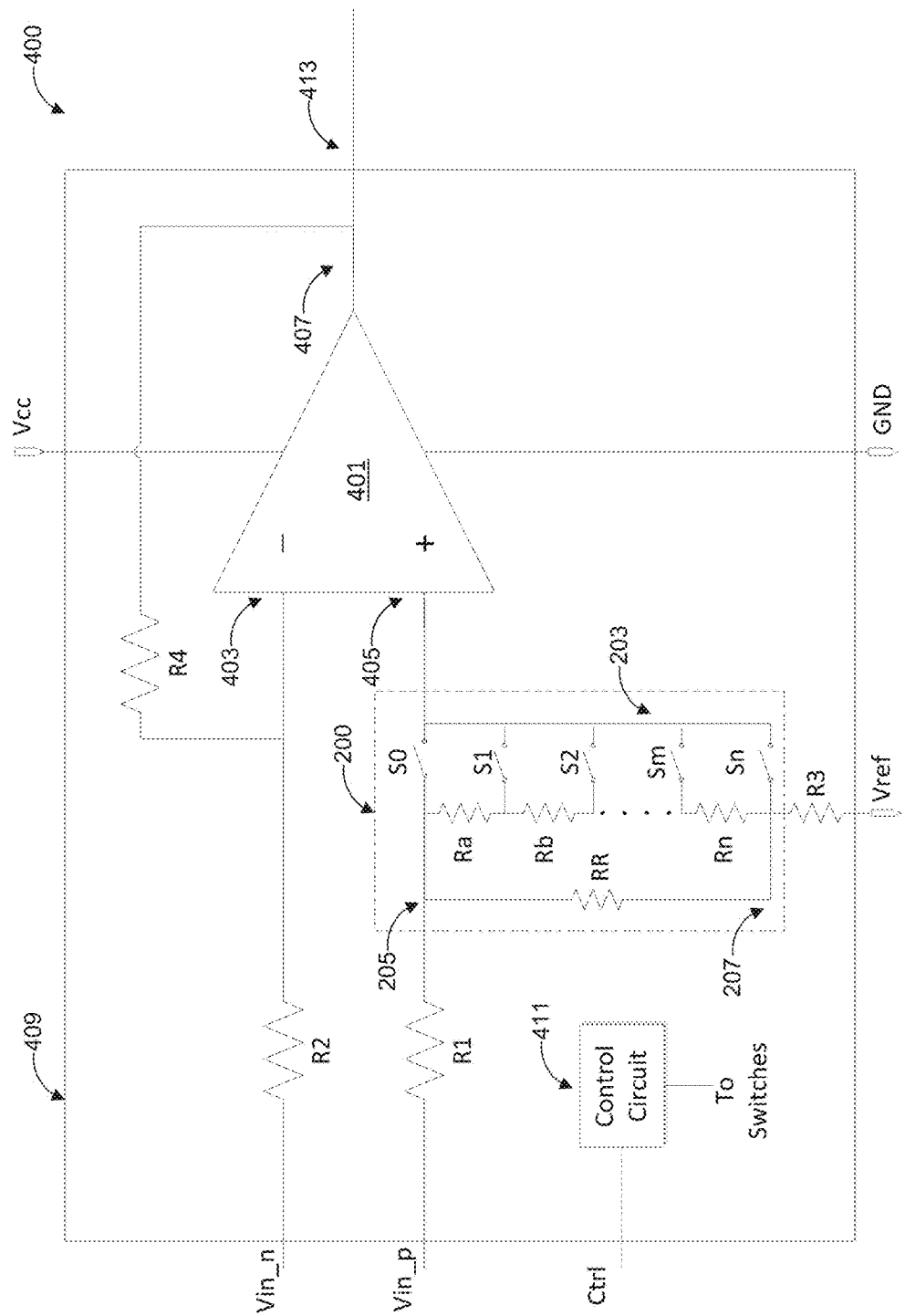
FIG. 4 is a schematic diagram illustrating an example difference amplifier circuit with a resistor network to calibrate the CMRR.
Figure 5:
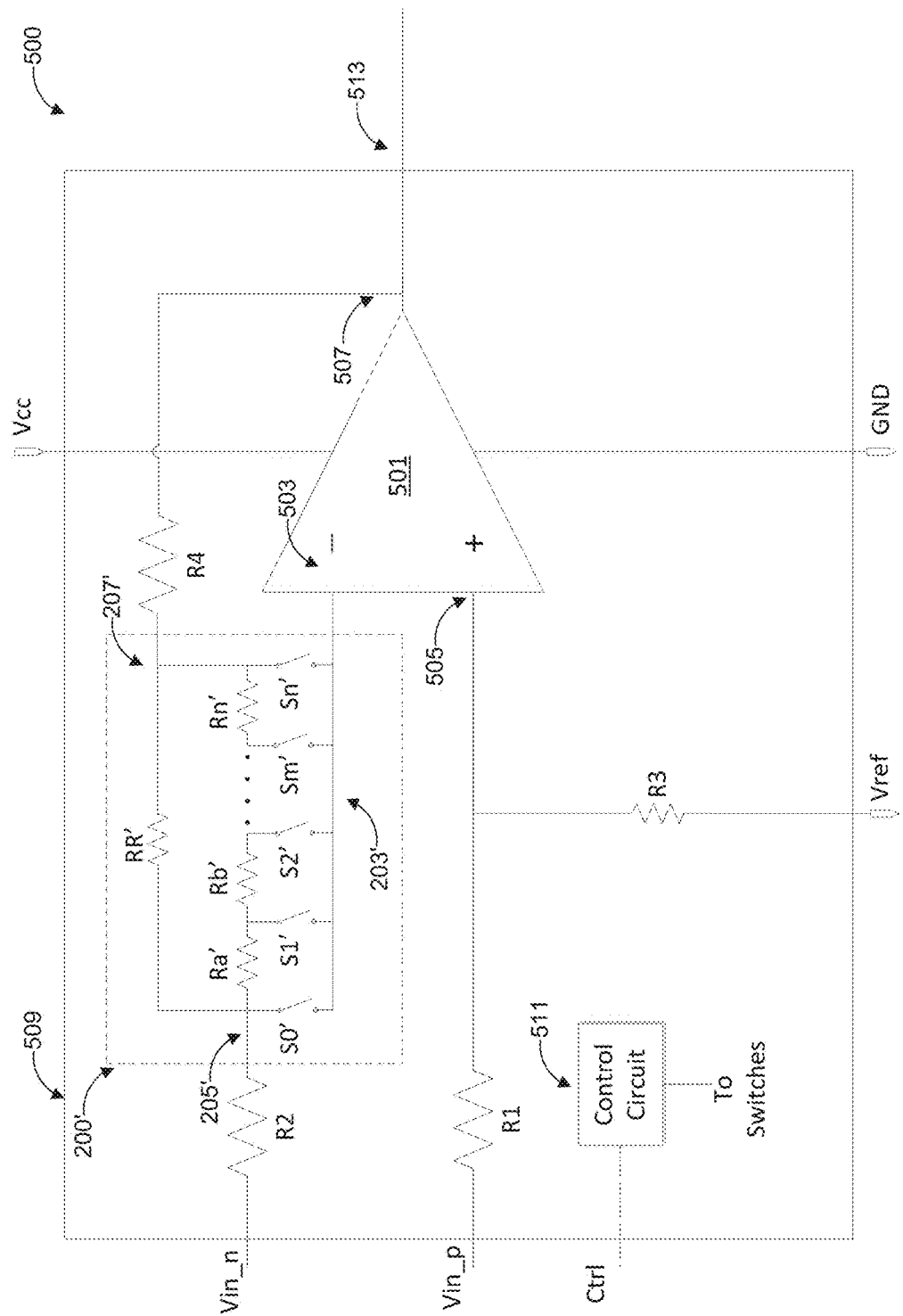
FIG. 5 is a schematic diagram illustrating an example difference amplifier circuit with a resistor string with a range resistor in parallel to calibrate the gain.

One way to calibrate resistances after packaging is to activate one or more switches in a resistor string (e.g., as shown in FIGS. 4-6) to add incremental resistances in series with a resistor to calibrate that resistor. In some embodiments, the resistor strings were fabricated on the same wafer as the difference amplifier. In some embodiments, the resistor strings are included inside the packaged difference amplifier. In some embodiments, a resistor string can be added outside of a packaged amplifier chip to tune one or more resistors. However, small resistors used to achieve fine calibration resolution can take up a lot of physical area, and switches can cause undesirable voltage drops.

Resistor strings can occupy very large areas on wafers. Resistance can be approximated by the equation Ω=ρL/A, where Ω is the resistance in ohms, ρ is the resistivity, L is the length, and A is the cross sectional area. For example, a 1,000 ohm resistor can be coupled to a resistor string with ten resistors of 1 ohm each so that the 1,000 ohm resistor may have its resistance adjusted by up to 10 ohms in increments of 1 ohm. If the 1 ohm resistors had the same resistivity and length as the 1,000 ohm resistor, then each 1 ohm resistor would have an area 1,000 times larger than the 1000 ohm resistor, and the resistor string of ten resistors would use 10,000 times more area. For a given fabrication process, the resistivity ρ can be decreased to a limited extent, and the length can be shortened as well up to a certain fabrication limit. Despite these limited adjustments, small resistance resistors can still require very large areas. This can make it prohibitively expensive to fabricate resistor strings on a wafer.

Figure 1:
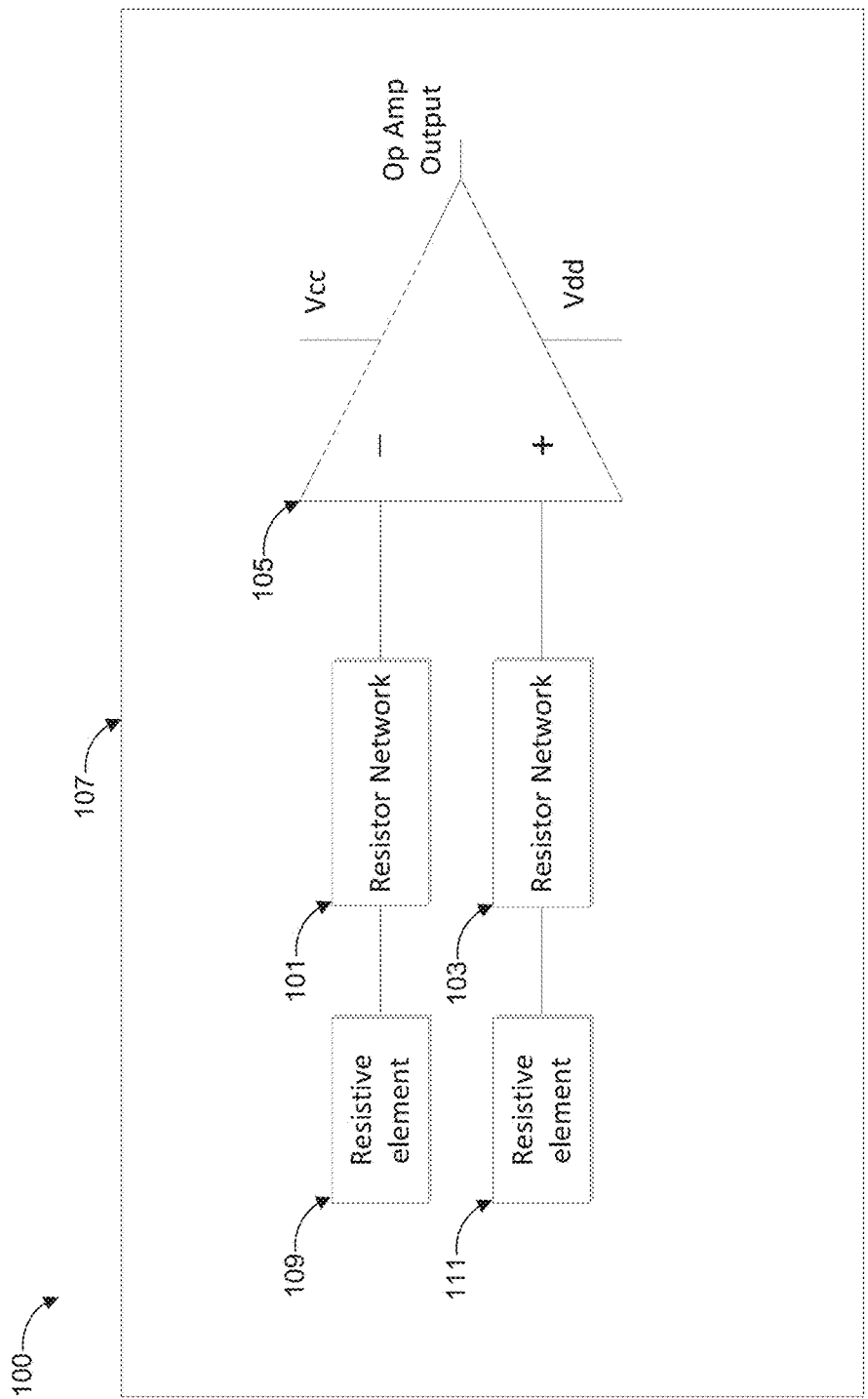
FIG. 1 is a schematic diagram illustrating an example of resistor networks coupled to an operational amplifier.
Figure 2:
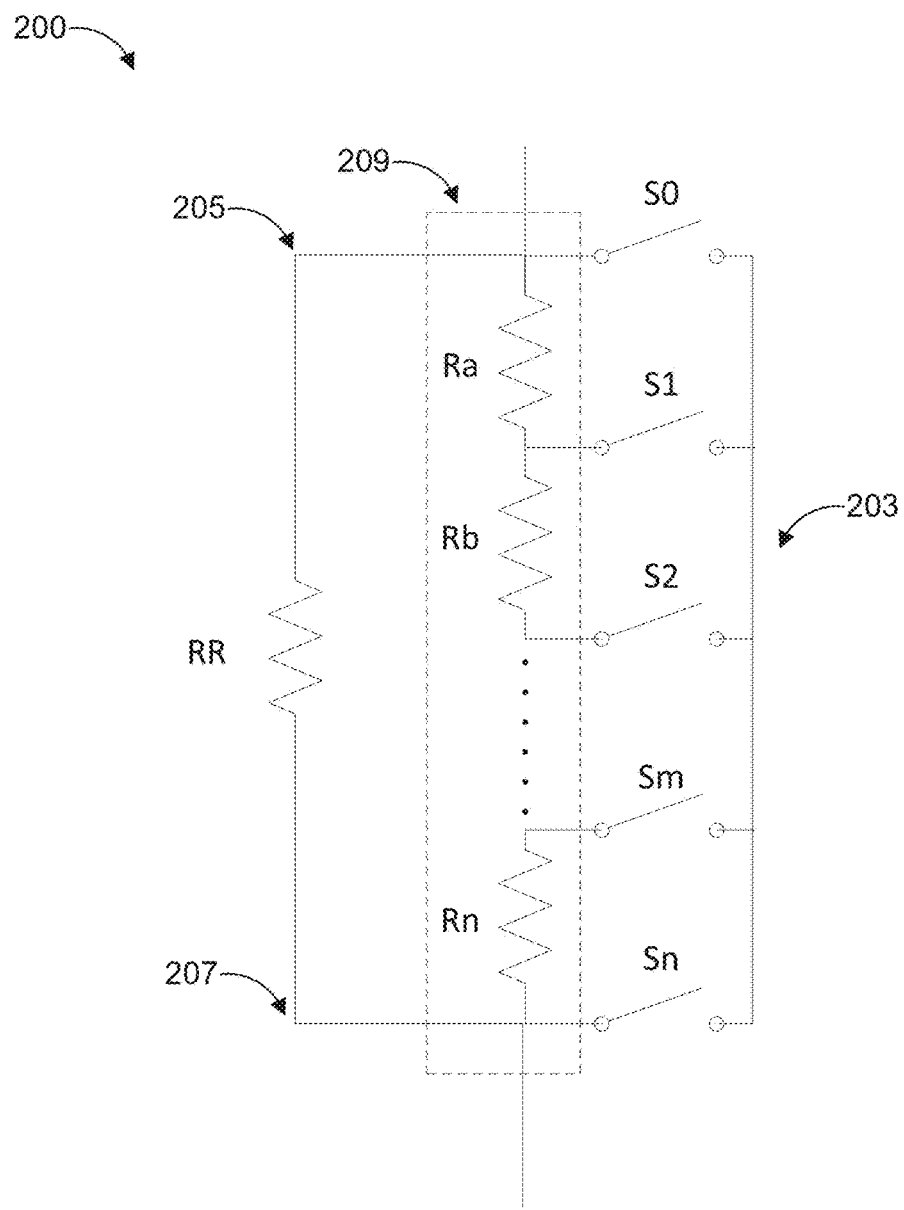
FIG. 2 is a schematic diagram illustrating an example of a resistor network including a resistor string in parallel with a range resistor RR.
Figure 3:
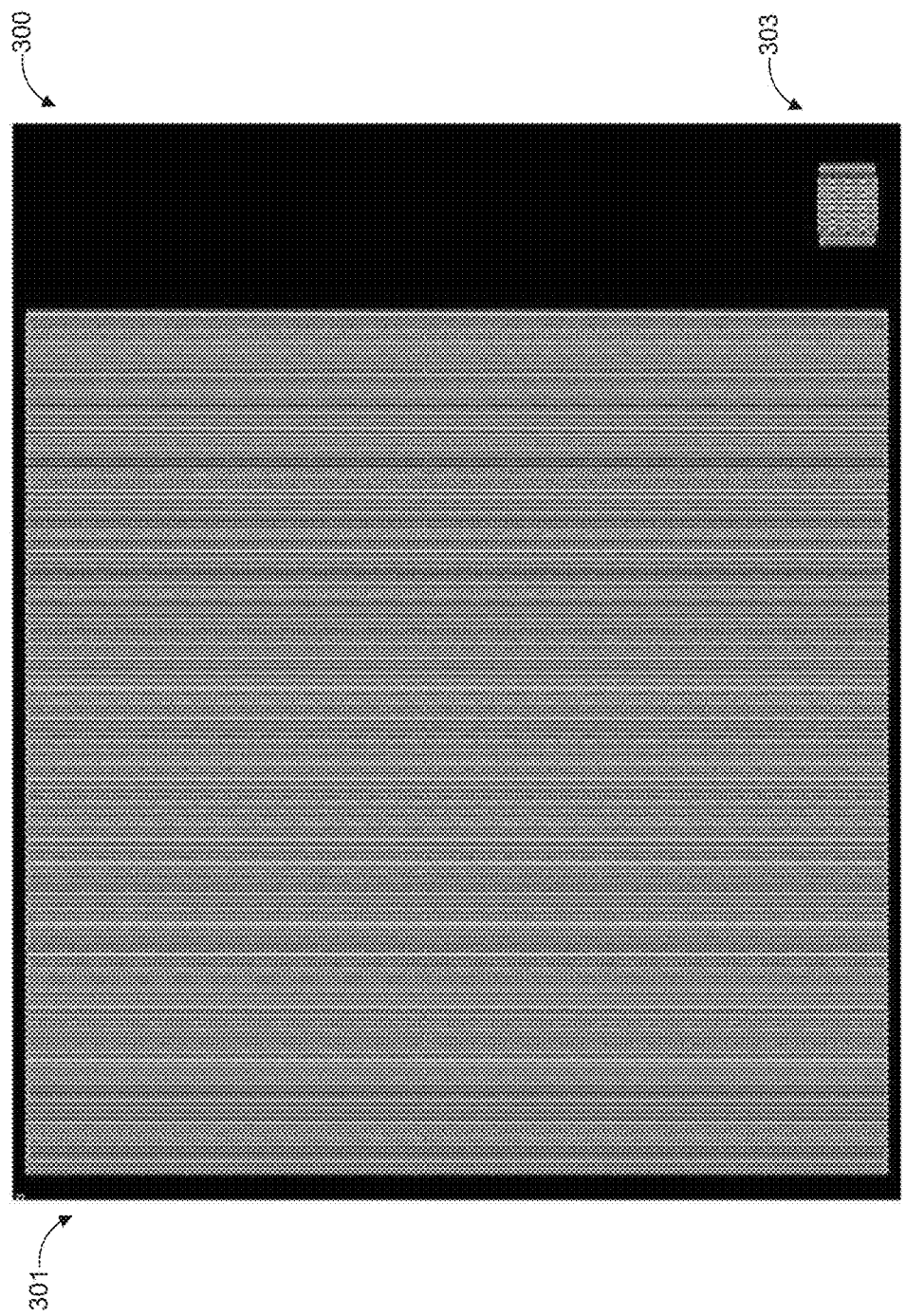
FIG. 3 shows an example image comparing the chip areas occupied by two different resistor strings.

To reduce the size of resistor strings, a range resistor can be coupled across the resistor string. The range resistor can have a smaller resistance and occupy a larger area than the resistors in the resistor string. Accordingly, in some embodiments, the addition of a range resistor that takes up a larger area than a resistor in the resistor string can reduce the overall size of the resistor string. By adding the range resistor, the resistors in a resistor string can be made with smaller sizes and larger resistances, while still achieving the same or similar resolution of calibration. For example, FIG. 3 shows a simulation comparing sizes resistor strings with and without the range resistor. Examples schematics of resistor strings with range resistors are shown in FIGS. 1 and 2.

Resistor strings can use switches, which can be implemented as transistors or other devices to select increments of resistors to be included in a series connection, thereby allowing calibration by increasing a series resistance. However, the on resistance of transistors and other types of switches are not well controlled, depend on bias conditions, and further vary with temperature. In a difference amplifier, the on resistance of switches can severely degrade the effectiveness of gain and CMRR calibration.

Accordingly, in some embodiments, the resistor string can be coupled to the amplifier input terminals so that very low or negligible amounts of current (e.g., nanoamps, picoamps, femtoamps, or lower) pass through the switches, and as a result, the on resistance of switches negligibly affects gain and CMRR calibration. This can be done by arranging the switches to couple to the op amp inputs, which allow very low or negligible amounts of current to pass. Examples of such arrangements are shown in FIGS. 4, 5, and 6.

Accordingly, the various embodiments disclosed herein may realize one, various combinations of, or all of the following advantages. Resistors can be calibrated. Resistors can be calibrated after packaging to account for packaging induced effects on resistance. Calibrated resistors can be used with an operational amplifier. A difference amplifier circuit can be calibrated. A difference amplifier can have a calibrated gain. A difference amplifier circuit can have a calibrated CMRR. Switches in the resistor string can be calibrated such that gain error is minimized compared to other configurations of switches in the resistor string. Switches in the resistor string can be calibrated such that CMRR is maximized compared to other configurations of switches in the resistor string. Resistor strings achieving a certain resolution can be made with smaller sizes. Calibration can be performed at fine resolutions for a circuit of a certain size. A resistor string that includes a range resistor can be smaller than, or similar in size to, a resistor string without the range resistor yet allow calibration to be at the same or similar resolution. The calibration can allow for fast settling times after a common mode input change because a resistor network is well balanced after calibration. An output can settle in a few microseconds, in less than a microsecond, or faster after large common mode input change such as 50 V. In at least one embodiment, the output settles in nanoseconds after a large common mode input change, such as 50 V.

Certain aspects, advantages, and novel features of the inventions have been described herein. It is to be understood that not necessarily all such advantages can be achieved in accordance with any particular embodiment of the invention. Thus, the invention can be embodied or carried out in a manner that achieves or optimizes one advantage or group of advantages as taught herein without necessarily achieving other advantages as can be taught or suggested herein.

Example Amplifier Circuit

FIG. 1 is a schematic diagram illustrating an example of an amplifier circuit 100 that includes resistor networks 101, 103 coupled to an operational amplifier 105. The operational amplifier 105 is encased in a package 107. The amplifier circuit 100 further includes resistive elements 109, 111 and can include other circuit elements (not shown).

The package 107 can induce stress on one or more resistive elements 109, 111. Furthermore, a number of other variables (e.g., manufacturing imperfections) can affect the resistance of resistive elements 109, 111.

As will be described in greater detail below, the resistor networks 101, 103 can include circuitry designed to calibrate the amplifier circuit 100 to compensate for resistance inaccuracies of circuit elements.

Resistor String Operation

FIG. 2 is a schematic diagram illustrating an example of a resistor network 200 that includes a resistor string 109 in parallel with a range resistor RR. Multiple switches S0, S1, S2, . . . Sm, Sn are coupled to different locations of the resistor string 109. In the illustrated embodiment, the resistor string 109 includes a plurality of resistors (or resistive elements) Ra, Rb, . . . Rn (where "n" can represent any number) coupled in a series between a first node and a second node. Together, the plurality of resistors Ra, Rb, . . . Rn form the resistor string 109. The range resistor RR is also coupled between the first node and the second node. The switches S0, S1, S2, . . . Sm, Sn are also coupled to a switch output node. Different combinations or permutations of switch states (open, closed) can be used to calibrate a resistance.

The plurality of switches S0, S1, S2, . . . Sm, Sn can be implemented as transistors, such as CMOS transistors, MEMS switches, or other types of switches. In the illustrated embodiment of FIG. 2, one end of each switch is coupled to a switch output node 203, and the different switches are coupled to different parts (or different "tap points") of the resistor string 209. With continued reference to the illustrated embodiment of FIG. 2, a second end of switch S0 is coupled to the first node 205 and also coupled to one end of resistor Ra, a second end of switch S1 is coupled to the second end of resistor Ra and also coupled to one end of resistor Rb, a second end of switch S2 is coupled to the second end of resistor Rb and also coupled to one end of the next resistor in the plurality of resistors, a second end of switch Sm is coupled to the first end of resistor Rn and also coupled to the second end of a resistor in the plurality of resistors that comes before resistor Rn, and a second end of switch Sn is coupled to the second end of resistor Rn and is also coupled to the second node 207. In some cases, the switches can be coupled to one or more additional resistors. For example, as illustrated in FIGS. 4 and 5, the second end of switch Sn can be coupled resistors R3 or R4, respectively, and/or the second end of switch S0 can be coupled resistor R1 or R2, respectively. In certain embodiments, the plurality of switches S0, S1, S2, . . . Sm, Sn can be activated such that different combinations or permutations of resistors Ra-Rn are included in a circuit pathway between the first node 205 and the second node 207. By including fewer or more resistors, a circuit pathway's resistance can be adjusted.

In some embodiments, one switch of the plurality of switches S0, S1, S2, . . . Sm, Sn is activated to electrically couple the resistor string 109 to the switch output node 203. The other switches can remain open. Depending on which switch is closed, a resistance measured from the switch output node 203 to the first node 205 can be adjusted while also adjusting a resistance measured from the switch output node 203 to the second node 207. In this way, the combination of switches can act as a digital "slider" that selects a position in the plurality of resistors Ra, Rb, . . . Rn to electrically couple to, thereby causing a different number of resistors to be included in a circuit path from the resistor 101 and the switch output node 203. In some embodiments, a connecting switch can physically slide. In some embodiments, due to the range resistor providing a low resistance parallel pathway and depending on resistance values of the plurality of resistors, a maximum calibration adjustment can be achieved when the switch is connected at different positions. The first ends of the plurality of switches S0, S1, S2, . . . Sm, Sn can be coupled to the respective ends of the various resistors in the plurality of resistors Ra, Rb, . . . Rn. The second ends of the plurality of switches can be coupled to the switch output node 203.

The switch output node 203 is coupled to a high impedance amplifier input such that negligible current or no current flows through the closed switch. In certain embodiments, the switch output node 203 can be coupled to a node with high impedance (e.g., in the giga-ohms, or more) relative (e.g., at least 1000 times greater, 10000 times greater, or more) to the impedance of other circuitry (e.g., the resistor network 200 in combination with any additional resistors, such as resistors R1-R4 of FIG. 6, etc.). In such embodiments, a voltage drop across the closed switch and the on resistance of the closed switch would be negligible due to the negligible amount of current passing through the switch. A switch according to some embodiments can have lower voltage drops (e.g., voltage drop of 100 mV or less, voltage drop of 1 $\mu$V or less, 1 nV or less, etc.). Accordingly, some embodiments address the scenario where a voltage drop across the switch could change with temperature or operating conditions and interfere with a previously set calibration. Because the current flow through a closed switch S1, S2, . . . Sn is nearly zero, the interference with a previously set calibration caused by these types of sources can be reduced to nearly zero. Accordingly, in some embodiments, the switches can be configured to drop negligible amounts of voltage and have negligible amounts of current.

The calibration range can be set, based at least in part, on the resistance of the range resistor RR. In some embodiments, the resistance of the range resistor can be significantly less than resistance of the resistor string such that the calibration range is determined primarily based on the resistance of the range resistor. To achieve a fine calibration resolution without using a range resistor RR, the resistance of elements in the resistor string can be much smaller than the resistance to be calibrated. For example, if a resistor (e.g., resistor R3 of FIG. 4) requiring calibration has a resistance of 10000 ohms, then the resistance of the range resistor can be in the range of 10 ohms, 1 ohm, etc. depending on how much the resistance of resistor R3 is to be adjusted by. If resistor R3 has a specified resistance of 10000 ohms and the effects of manufacturing process variation, package stress, thermal events, and physical degradation might cause ±1%, then the range resistor could be about 100 ohms to compensate for the range. In terms of the resolution, calibration adjustments at 1 ohm increments would allow an accuracy of 0.01% to be achieved. Without a range resistor, the range and resolution would be set by the resistance values of the resistors Ra, Rb, . . . Rn, and to achieve a range of 100 ohms with 1 ohm resolution, n=100 resistors of of 1 ohm would be needed. However, 100 resistors of 1 ohm each would occupy a large silicon area, increase manufacturing costs, and increase parasitic capacitance. By using coupling 100 ohm range resistor in parallel, the resistors Ra, Rb, . . . Rn can have much larger resistances (e.g., 100 ohm, 500 ohm, or 10000 ohm) and occupy much smaller sizes, yet the same calibration range of 100 ohms and the same resolution of 1 ohm can be achieved. In some cases, a relatively larger range resistor resistance can use less chip area and increase the available calibration range at the expense of calibration resolution. In certain cases, a smaller range resistor resistance can decrease the available calibration range and improve calibration resolution while using more chip area.

The plurality of resistors Ra, Rb, . . . Rn can be coupled in parallel with the range resistor RR between a first node 205 and a second node 207. The plurality of resistors can be made of resistors fabricated on a die, made of any material where the dominant characteristic is resistance, or made of any material used for its resistive characteristic. In some embodiments, the plurality of resistors are resistive segments that form a resistive strip, and the switches S0, S1, S2, . . . Sm, Sn can connect between resistive segments of the resistive strip. The number of resistors Ra, Rb, . . . Rn, the resistances of resistors Ra, Rb, . . . Rn, and the resistance of the range resistor RR affect the granularity or resolution of the calibration. In some embodiments, each of the plurality of resistors Ra, Rb, . . . Rn can have the same resistance value. In some embodiments, the plurality of resistors Ra, Rb, . . . Rn can have different resistance values from each other. In certain embodiments, the resistors Ra, Rb, . . . Rn can have a resistance selected to reduce and/or minimize the size of the plurality of resistors. In some embodiments, the plurality of resistors, as well as any resistor of the plurality of resistors, can be smaller in physical size than the range resistor. In some embodiments, each of the plurality of resistors can have a resistance that is greater than the resistance of the range resistor by a factor of 2, 5, 10, 100, 1000, 10000, or higher.

In some embodiments, with the range resistor RR coupled in parallel with the resistor string 109, the circuit can achieve approximately the same calibration resolution using resistors in a resistor string with higher resistances and smaller areas then it otherwise would without the range resistor RR. The effects can be illustrated with three scenarios:

In a first scenario, the plurality of resistors Ra, Rb, . . . Rn includes 100 resistors, each with resistances of 1 ohm, without a parallel range resistor. A plurality of switches might operate to include up to 100 of those 1 ohm resistors along a circuit path so that the circuit path can be calibrated to add from 0 to 100 ohms in 1 ohm increments. However, each of the 1 ohm resistors would take up a relatively large area on a die because the cross sectional area A would be relatively large according to the equation $\Omega = \rho L/A$.

In a second scenario, the plurality of resistors Ra, Rb, . . . Rn includes 100 resistors, each with resistances of 1 kilo-ohm, without a parallel range resistor. Each of the 1 kilo-ohm resistors would take up a die area 1000 times smaller than the area taken up by the 1 ohm resistors. However, a plurality of switches could operate to include up to 100 of those 1 kilo-ohm resistors along a circuit path so that the circuit path can be calibrated to add from 0 to 100 kilo-ohm in 1 kilo-ohm increments, a resolution 1000 times lower compared to the first scenario.

In a third scenario, a parallel range resistor of 100 ohms is added to a plurality of resistors Ra, Rb, . . . Rn that includes 100 resistors, each with resistances of 1 kilo-ohm. A plurality of switches might operate to include up to 100 of those 1 kilo-ohm resistors along a circuit path. However, due to the presence of the 100 ohm parallel range resistor, the circuit path can be calibrated to add from 0 to approximately 100 ohms in 100 increments of approximately 1 ohm. Furthermore, the die area occupied by the one 100 ohm resistor would be approximately 100000 times smaller than the die area occupied by the one hundred 1 ohm resistors in the first scenario while achieving a fine resolution that is approximately the same as the resolution achieved in the second scenario.

Example Size Savings

FIG. 3 shows an example image 300 comparing the chip areas occupied by two different resistor strings. A first area 301 shows the size of a first resistor string without a parallel range resistor. A second area is 303 shows the size of a second resistor string with a parallel range resistor, where second resistor string has a resolution and calibration range comparable to the first resistor string.

The image 300 is approximately to scale. The first resistor string 101 has thirty two resistors of 1 ohm each. The silicon area occupied by the first resistor string, including the resistor material and metals, is approximately 330 μm×330 μm.

The second area is 303 includes the resistor material for one 32 ohm range resistor, the resistor material for the second resistor string of 32 resistors (each with resistances of 200 ohm), and associated metals for interconnections. The silicon area occupied by the second area is approximately 30 μm×25 μm, approximately 150 times less area.

Example Difference Amplifiers

FIG. 4 is a schematic diagram illustrating an example difference amplifier circuit 400 with a resistor network 200 to calibrate the CMRR. In the illustrated embodiments, the difference amplifier circuit 400 includes an operational amplifier 401 that has an inverting input 403, a noninverting input 405, and an op amp output 407. The difference amplifier circuit 400 also includes resistors R1, R2, R3, and R4 coupled to the amplifier 401 in a difference amplifier configuration; the resistor network 200; and a control circuit 411. The resistor R3 is coupled to the resistor network 200 (further described with respect to FIG. 2) that includes a range resistor RR; a resistor string comprising a plurality of resistors Ra, Rb, . . . Rn; and a plurality of switches S0, S1, S2, . . . Sm, Sn. In the illustrated embodiment, the package 409 encapsulates the circuit 400. Package ports can include input port Vin_n, input port Vin_p, a control signal port Ctrl, a power supply Vcc, a ground port GND, a voltage reference Vref, and an output port 413.

The operational amplifier 401, in the illustrated embodiment, is configured to amplify a differential signal by a gain factor. The differential signal is provided through Vin_n, which couples to the inverting input 403 of the operational amplifier 401, and Vin_p, which couples to the noninverting input 405 of the operational amplifier 401. The amplified signal is produced at the output port 413. The operational amplifier 401 receives power through Vcc and GND.

The resistor R2, in the illustrated embodiment, is coupled to the Vin_n port and the inverting input 403. The resistor R4 is coupled in a feedback configuration to the operational amplifier output 407 and to the inverting input 403.

In the illustrated embodiment, the noninverting input 405 of the operational amplifier 401 is coupled to the switch output node 203 of the resistor network 200, the resistor R1 is coupled to the Vin_p port and to the first node 205 of resistor network 200, and the resistor R3 is coupled to the Vref port and to the second node 207 of resistor network 200.

The inputs 403, 405 to the operational amplifier can have a very high impedance (e.g., in the giga-ohms, or more) relative (e.g., at least 1000 times greater, 10000 times greater, or more) to the impedance of other circuitry such as the resistor R1, resistor R3, and the resistor network 200. Accordingly, in some embodiments, the switches S0-Sn can be configured such that very low or negligible amounts of current will pass through a switch to the very high impedance node when one switch is closed.

The control circuit 411 can be configured to control the switches S0, S1, S2, . . . Sm, Sn to calibrate the performance of the difference amplifier by improving the CMRR. The difference amplifier can be tested, and based on the test results, the control circuit can activate, deactivate, or otherwise set the switches S0, S1, S2, . . . Sm, Sn. The difference amplifier can be tested after the difference amplifier is packaged to account for the effects of packaging. Testing can be done with external equipment or built in self-test circuitry. Based on the test results, the control circuit 411 can send control signals to the switches S0, S1, S2, . . . Sm, Sn to activate/deactivate them. In some embodiments, a control signal can be sent to the control circuit 411 through a control port Ctrl. In certain embodiments, a control signal can be sent to the control circuit 411 through one or more of the other ports in the package, including through various combinations of the other ports. The control circuit 411 can activate/deactivate the switches S0, S1, S2, . . . Sm, Sn by blowing fuses, turning on or off transistors, etc. based on the switch implementation.

Depending on which switch is closed, the effective resistance of resistor R3 or resistor R1, as measured from the switch output node, can change, effectively allowing calibration of the R3/R1 ratio. Thus, the ratios R3/R1 can be calibrated to more closely match R4/R2. A combination or permutation of states of the switches S0, S1, S2, . . . Sm, Sn can be selected. In some embodiments, the selected switch state can cause the CMRR to be maximized compared to other switch states. However, it will be understood that any switch can be activated as desired, and that switches can be set for purposes other than maximizing the CMRR (e.g., tuning the gain).

FIG. 5 is a schematic diagram illustrating an example difference amplifier circuit 500 with a resistor network 200' to calibrate the gain. In the illustrated embodiments, the difference amplifier circuit 500 includes an operational amplifier 501 that has an inverting input 503, a noninverting input 505, and an op amp output 507. The difference amplifier circuit 500 also includes resistors R1, R2, R3, and R4 coupled to the amplifier 501 in a difference amplifier configuration; the resistor network 200'; and a control circuit 511. The resistor R2 is coupled to the resistor network 200' (further described with respect to FIG. 2) that includes a range resistor RR'; a resistor string comprising a plurality of resistors Ra', Rb', . . . Rn'; and a plurality of switches S0', S1', S2', . . . Sm', Sn'. in the illustrate embodiment, the package 509 encapsulates the circuit 500. Package ports can include input port Vin_n, input port Vin_p, a control signal port Ctrl, a voltage supply Vcc, a ground port GND, a voltage reference Vref, and an output port 513.

The operational amplifier 501 is configured to amplify a differential signal by a gain factor. The differential signal is provided through Vin_n, which couples to the inverting input 503 of the operational amplifier 501, and Vin_p, which couples to the noninverting input 505 of the operational amplifier 501. The amplified signal is produced at the output port 513. The operational amplifier 401 receives power through Vcc and GND.

The resistor R1, in the illustrated embodiment, is coupled to the Vin_p port and to the noninverting input 505. The resistor R3 is coupled to the Vref port and to the noninverting input 505.

In the illustrated embodiment, the inverting input 503 of the operational amplifier 501 is coupled to the switch output node' 203' of the resistor network 200'. The resistor R2 is coupled to the Vin_n port and to a first node 205' the resistor network 200'. The resistor R4 is coupled in a feedback configuration to the op amp output 507 and to a second node 207' of the resistor network 200'.

The inputs 503, 505 to the operational amplifier can have a very high impedance (e.g., in the giga-ohms, or more) relative (e.g., at least 1000 times greater, 10000 times greater, or more) to the impedance of other circuitry such as the resistor R2, resistor R4, and the resistor network 200'. Accordingly, the switches can be configured such that very low or negligible amounts of current will pass through a switch to the very high impedance node when one switch is closed.

The control circuit 511 is configured to control the switches S0', S1', S2', . . . Sm', Sn' to calibrate the performance of the operational amplifier by improving the gain. Control circuit 511 can operate similarly to (or be the same circuit as) control circuit 411, described with respect to FIG. 4.

Depending on which switch is closed, the effective resistance of resistor R2 or resistor R4, as measured from the switch output node, is changed, effectively allowing calibration of resistor R2 and resistor R4. Thus, the ratio R4/R2 can be calibrated to refine the gain. A combination or permutation of states of the switches S0', S1', S2', . . . Sm', Sn' can be selected. In some embodiments, the selected switch state can cause the gain to match a target gain more closely compared to other switch states. However, it will be understood that any switch can be active as desired.

FIG. 6 shows an example difference amplifier circuit 600 with two resistor networks for calibrating the CMRR and for calibrating the gain, respectively. The circuit of FIG. 6 combines features of circuits 400 and 500, described with respect to FIGS. 4 and 5. The control circuit 611 can be configured to control the switches of both resistor networks.

In addition to using a resistor network to calibrate CMRR and another resistor network to calibrate the gain, the two resistor networks can be used together to differentially calibrate the gain according to the equations disclosed above.

Example Methods

Figure 7:
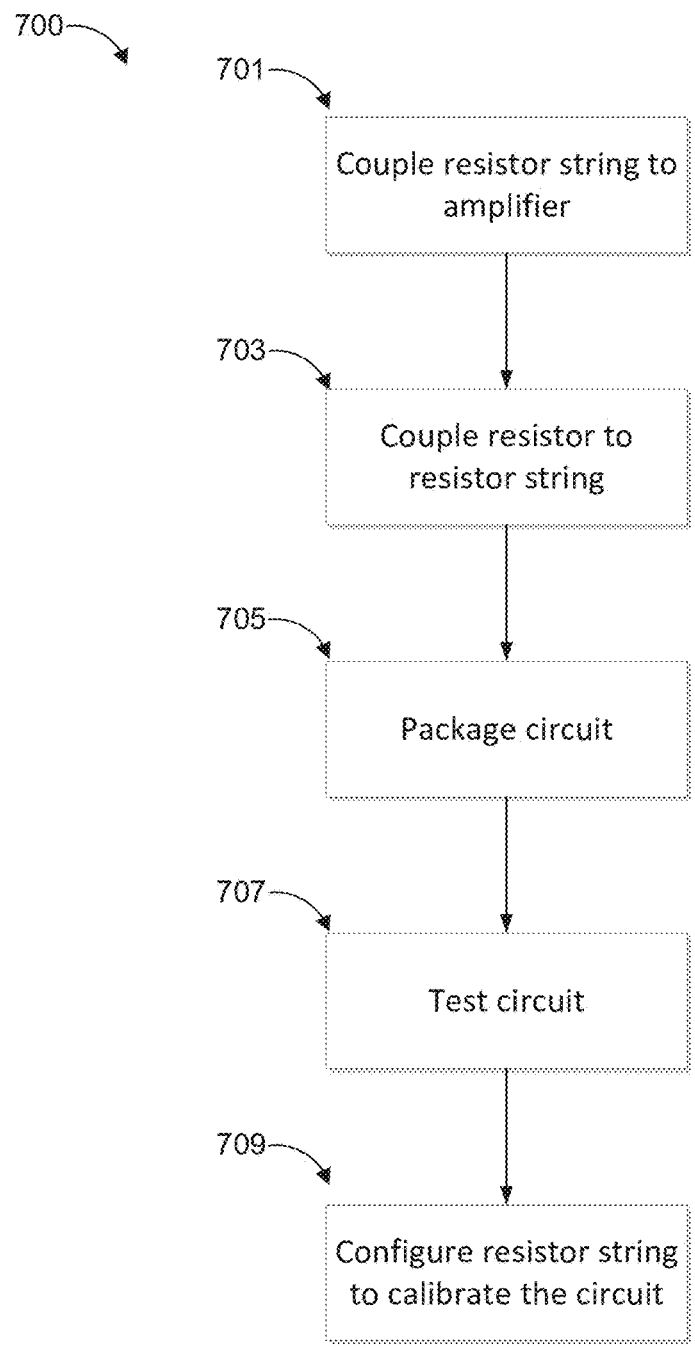
FIG. 7 shows a block diagram of an example method for calibrating a circuit.

FIG. 7 shows a block diagram 700 of an example method for calibrating a circuit.

At block 701, a resistor string is coupled to an amplifier. The resistor string can be a resistor string that includes a plurality of resistors. The resistor string can include a plurality of switches, where each of the switches is coupled to a switch output node. The switch output node of the resistor string can be coupled to an input of the operational amplifier.

At block 703, a resistor is coupled to the resistor string. As described in greater detail above, in some embodiments, the resistor can be a range resistor that is coupled in parallel with the resistor string. The calibration range can be set based, at least in part, on the resistance of the range resistor. The range resistor can have any resistance. In some embodiments, the range resistor can have a smaller resistance than the plurality of resistors or any resistor of the plurality of resistors. The range resistor can have a smaller, similar, or larger area than the area of the plurality of resistors or the area of any resistor of the plurality of resistors.

At block 705, the circuit is packaged. The circuit can include any one or any combination of the components described above with reference to FIGS. 1-6 or any other arrangement of resistors or electronic components. The circuit can be fabricated on a die. The packaging process can induce stress effects on the circuit. Furthermore, the packaging materials, thermal effects of the packaging process, or other packaging effects may also affect a number of properties of the packaged circuit. The variety of effects can cause components values to deviate from specified parameters.

At block 707, the circuit can be tested. Testing the circuit can allow the circuit parameters, such as CMRR or gain, to be determined. The testing can be performed after the circuit is packaged so that any packaging effects on CMRR or gain are reflected in the test results. Accordingly, it can be determined which switches to activate to calibrate the circuit. An example method of testing the circuit is described with respect to FIG. 8.

At block 709, the resistor network can be configured to calibrate the circuit. Switches of the resistor network, as described in greater detail above, can be activated or deactivated to calibrate the CMRR or gain. In some embodiments, the resistor network can be configured so as to increase and/or maximize the CMRR. Furthermore, in certain embodiments, the resistor network can be configured so as to calibrate the gain of the circuit with greater accuracy. In some cases, calibrating the circuit using the resistor network can account for the effects of packaging of the circuit.

Figure 8:
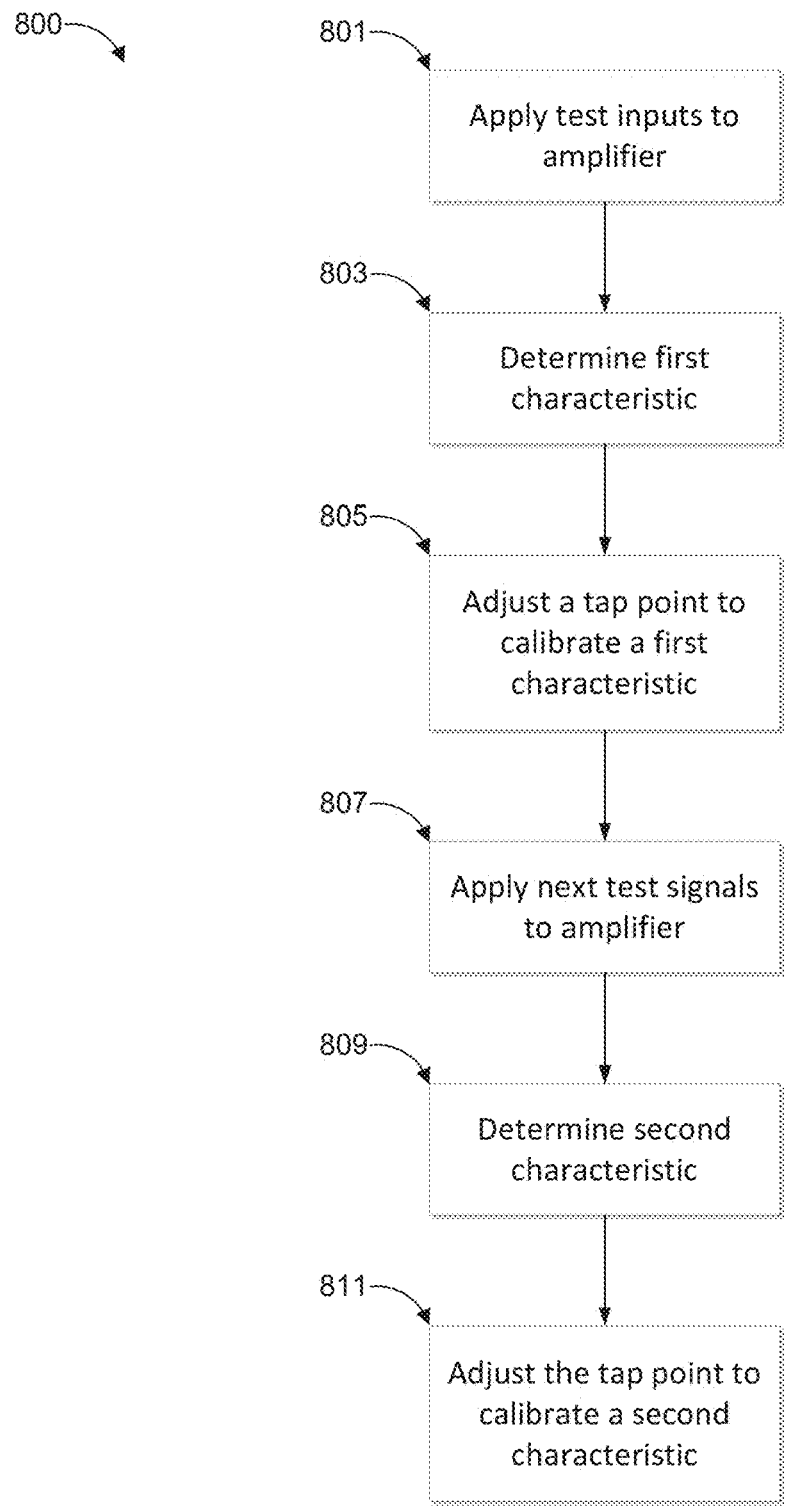
FIG. 8 shows a block diagram of an example method for testing a circuit.

FIG. 8 shows a block diagram 800 of an example method for testing a circuit.

At block 801, first test inputs can be provided to the amplifier. The first test inputs can be used to cause a measurable manifestation of a first characteristic of the circuit. At block 803, based on the first test inputs, a first characteristic (e.g., the gain or CMRR) of the circuit can be determined. At block 805, the tap point of resistor network (e.g., as shown in FIG. 2) can be adjusted to calibrate the first characteristic. The tap point can be a part of a resistor string that an amplifier is coupled to. The tap point can be set to a position where the first characteristic is calibrated relative to other tap points. The tap point can be set to a single position of the resistor string. In some embodiments, adjusting the tap point can include switching on and off different combinations and/or permutations of switches and measuring the first characteristic for each combination and/or permutation, and the tap point causing the best result can selected. In some embodiments, the tap point can be set with reference to a look-up table or calculation based on the determination of the characteristic at block 803 (e.g., if the characteristic is too low by 3%, then set the tap point to position X). Adjusting the tap point can be performed until an optimum value for the first characteristic is reached compared to other tap points or until the first characteristic reaches a specified range/threshold.

At block 807, second test inputs can be provided to the amplifier. The second test inputs can be used to cause a measurable manifestation of a second characteristic of the circuit. At block 809, based on the second test inputs, a second characteristic (e.g., the gain or CMRR) of the circuit can be determined. At block 811, the tap point of resistor network (e.g., as shown in FIG. 2) can be adjusted to calibrate the second characteristic. The tap point can be a part of a resistor string that an amplifier is coupled to. The tap point can be set to a position where the second characteristic is calibrated relative to other tap points. The tap point can be set to a single position of the resistor string. In some embodiments, adjusting the tap point can include switching on and off different combinations and/or permutations of switches and measuring the second characteristic for each combination and/or permutation, and the tap point causing the best result can selected. In some embodiments, the tap point can be set with reference to a look-up table or calculation based on the determination of the characteristic at block 809 (e.g., if the characteristic is too high by 2%, then set the tap point to position Y). Adjusting the tap point can be performed until an optimum value for the second characteristic is reached compared to other tap points or until the second characteristic reaches a specified range/threshold.

The tap points set to calibrate the first characteristic can be set on a different part of the circuit than the tap point set to calibrate the second characteristic (e.g., the different resistor networks 200 and 200' as shown in FIG. 6). In some embodiments, the CMRR can be calibrated first, then the gain. In some embodiments, the gain can be calibrated first, then the CMRR.

Additional Embodiments

Although a number of calibration techniques are disclosed with respect to a difference amplifier, a resistance can be adjusted to calibrate a variety of circuits and electronic devices. Amplifiers can be used as a buffer amplifier, a difference amplifier, a differentiator, a filter, an instrumentation amplifier, an inverting amplifier, a noninverting amplifier, an oscillator, a summing amplifier, or any number of other applications. Accordingly, the technology discussed herein can be broadly applied. The resistor networks described can be coupled to an op amp in any type of electronic device. The resistor networks described can be coupled to any high input node (not necessarily on an amplifier) such that little or negligible current flows through the switches.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog-to-digital converters, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, and disk driver circuits. Consumer electronic products can include, but are not limited to, wireless devices, a mobile phone (for example, a smart phone), healthcare monitoring devices, vehicular electronics systems such as automotive electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products. Further, products can include high-voltage applications such as vehicle control circuits in cars, actuators in heavy or industrial machinery, aerospace technology, etc. Because a high CMRR can be achieved, a tuned differential amplifier can be used in high-voltage applications, lower voltage applications, or applications where the voltage ranges from low to high.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error. Some discussions of the circuit and principles may make simplifying assumptions and estimates for clarity and to improve understanding.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements, and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A circuit for calibrating a performance characteristic of an amplifier system comprising:
    an operational amplifier comprising a first input, a second input, and an output;
    a resistor network coupled to the first input of the operational amplifier and configured to adjust a ratio of resistances, the resistor network comprising:
        a range resistor electrically coupled in parallel to a resistor string, and
        a plurality of switches coupled to the resistor string, wherein the plurality of switches are coupled to each other in parallel with respect to the resistor string and with respect to an output of the resistor network; and
    a plurality of resistors arranged to configure the operational amplifier as a difference amplifier, the plurality of resistors including: a first resistor coupled to a first input of the difference amplifier, a second resistor coupled to a second input of the difference amplifier, a third resistor coupled to a reference voltage, and a fourth resistor coupled to the output of the difference amplifier.

2. The circuit of claim 1, wherein the output of the resistor network is coupled to the first input of the operational amplifier such that less than one nanoamp of current passes through any of the plurality of switches that are turned on.

3. The circuit of claim 2, wherein the first resistor and the third resistor are coupled through the resistor network to the first input of the operational amplifier.

4. The circuit of claim 1, wherein the resistor network is coupled to the output of the operational amplifier.

5. The circuit of claim 1, wherein activation of different switches of the plurality of switches couples the first input to different parts of the resistor string.

6. The circuit of claim 1, wherein the resistor network is coupled to a selected resistor of the plurality of resistors such that a resistance of the selected resistor in combination with a resistance of the resistor network affects a common mode rejection ratio or a gain of the difference amplifier.

7. The circuit of claim 1, wherein the resistor network is coupled in a feedback configuration to the fourth resistor and to the second input of the operational amplifier.

8. The circuit of claim 1, wherein a resistance of the range resistor is at least five times smaller than a resistance of any resistor of the plurality of resistors.

9. The circuit of claim 1, wherein the plurality of resistors occupies a smaller die area than a die area occupied by the range resistor.

10. The circuit of claim 1, wherein the plurality of switches is implemented as a plurality of transistors, and wherein voltage drops across any activated transistor of the plurality of transistors are less than 0.1 V.

11. A circuit for calibrating a difference amplifier, the circuit comprising:
    an operational amplifier configured to amplify a difference between a signal at a first input and a signal at a second input; and
    means for adjusting a common mode rejection ratio (CMRR) independently of adjusting a gain of the difference amplifier, the means for adjusting comprising:
        means for electrically coupling the operational amplifier to different parts of a resistor string; and means electrically coupling a range resistor in parallel to the resistor string.

12. The circuit of claim 11, wherein the means for electrically coupling the operational amplifier to different parts of the resistor string comprises a plurality of switches, wherein each switch of the plurality of switches is coupled to the first input of the operational amplifier, wherein different switches of the plurality of switches is coupled to the different parts of the resistor string, wherein activation of a first switch configures the different amplifier with a first CMRR, and wherein activation of a second switch configures the difference amplifier with a second CMRR.

13. The circuit of claim 11, further comprising a means for adjusting the gain of the difference amplifier.

14. The circuit of claim 11, wherein the means for electrically coupling the operational amplifier to different parts of the resistor string comprises a plurality of switches coupled in parallel to each other with respect to the operational amplifier and with respect to the resistor string, and wherein a particular switch of the plurality of switches is configured to cause the operational amplifier to be coupled to a particular part of the resistor string.

15. The circuit of claim 11, wherein the means for electrically coupling the operational amplifier to different parts of the resistor string comprises a means for electrically coupling the operational amplifier to only one part of the resistor string at a time.

16. The circuit of claim 15, wherein the operational amplifier is coupled to a first part of the resistor string such that the CMRR is greater than a specified value compared to a result when the operational amplifier is coupled to a different part of the resistor string.

17. The circuit of claim 11, wherein the resistor string comprises a plurality of resistors, wherein the range resistor has a smaller resistance than any resistor of the plurality of resistors, and wherein the range resistor occupies a larger die surface area than the plurality of resistors.

18. The circuit of claim 11, wherein resistances of resistors in the resistor string are at least five times larger than a resistance of the range resistor.

19. A method for calibrating an amplifier circuit, the method comprising:
applying a first test input voltage to a range resistor coupled in parallel with a resistor string; and
adjusting a tap point at which the resistor string is contacted such that a common mode rejection ratio threshold is satisfied, wherein adjusting the tap point comprises turning on and off different combinations of one or more switches, wherein the one or more switches are coupled to different tap points of the resistor string and also coupled to a noninverting terminal of an operational amplifier that prevents more than a 1 nanoamp of current from flowing through any of the one or more switches that are turned on.

20. The method of claim 19, wherein there is zero current through the switches that are turned on.

21. A circuit for calibrating a difference amplifier, the circuit comprising:
an operational amplifier configured to amplify a difference between a signal at a first input and a signal at a second input; and
a resistor network configured to adjust a common mode rejection ratio (CMRR) independently of adjusting a gain of the difference amplifier, the resistor network comprising:
a plurality of switches configured to electrically couple the operational amplifier to different parts of a resistor string, and
a range resistor electrically coupled in parallel to the resistor string.

22. The circuit of claim 21, wherein each switch of the plurality of switches is configured to electrically couple the operational amplifier to a different part of the resistor string.

23. The circuit of claim 21, wherein resistances of resistors in the resistor string are at least five times larger than a resistance of the range resistor.

24. The circuit of claim 21, wherein the resistor string is configured to be coupled to the operational amplifier by only one switch of the plurality of switches at a time, and wherein a voltage drop across the one switch is less than 0.1 V when the one switch is activated.

25. The circuit of claim 21, further comprising a second resistor network configured to adjust the gain of the difference amplifier, the second resistor network comprising:
a second plurality of switches configured to electrically coupled the operational amplifier to different parts of the second resistor string; and
a second range resistor coupled in parallel to the second resistor string.

26. The circuit of claim 25, wherein each switch of the second plurality of switches is configured to electrically couple the operational amplifier to a different part of the second resistor string.

* * * * *